US009130145B2

(12) United States Patent
Martin et al.

(10) Patent No.: US 9,130,145 B2
(45) Date of Patent: Sep. 8, 2015

(54) SURFACE ACOUSTIC WAVE COMPONENT

(71) Applicant: Vectron International GmbH, Teltow (DE)

(72) Inventors: Guenter Martin, Dresden (DE); Bernd Steiner, Rangsdorf (DE)

(73) Assignee: Vectron International GmbH, Teltow (DE)

( * ) Notice: Subject to any disclaimer, the term of this patent is extended or adjusted under 35 U.S.C. 154(b) by 401 days.

(21) Appl. No.: 13/851,280

(22) Filed: Mar. 27, 2013

(65) Prior Publication Data

US 2013/0257220 A1     Oct. 3, 2013

(30) Foreign Application Priority Data

Mar. 29, 2012  (DE) .......................... 10 2012 205 107

(51) Int. Cl.
*H01L 41/047* (2006.01)
*H03H 9/145* (2006.01)

(52) U.S. Cl.
CPC ......... *H01L 41/047* (2013.01); *H03H 9/14547* (2013.01)

(58) Field of Classification Search
CPC ................................................. H03H 9/14547
USPC ........... 310/313 B, 313 R, 311; 333/193–195
See application file for complete search history.

(56) References Cited

U.S. PATENT DOCUMENTS

| | | | | |
|---|---|---|---|---|
| 4,746,882 A * | 5/1988 | Solie | .......................... | 310/313 B |
| 5,831,492 A * | 11/1998 | Solie | .......................... | 310/313 B |
| 6,023,122 A * | 2/2000 | Liu et al. | .................. | 310/313 B |
| 6,469,598 B2 * | 10/2002 | Tsuzuki et al. | .......... | 310/313 B |
| 6,577,041 B1 | 6/2003 | Martin | | |
| 6,856,214 B2 | 2/2005 | Jian et al. | | |
| 2002/0057035 A1 * | 5/2002 | Nakamura et al. | ........ | 310/313 B |

FOREIGN PATENT DOCUMENTS

| | | |
|---|---|---|
| DE | 199 25 800 | 12/2000 |
| DE | 199 43 072 | 12/2000 |

OTHER PUBLICATIONS

Steiner, Berd, "Optimising Slanted-Finger Interdigital Transducers (SFIT) Filters" in Proc. 2001 IEEE Ultrasonics Symposium, pp. 1-5. (Spec., pg. 2).
H. Yatsuda, "Design Techniques for SAW Filters Using Slanted Finger Interdigital Transducers," IEEE Trans. Ultrasonics, Ferroelectrics, and Frequency Control vol. 44 (1997), pp. 453-459. (Spec, pg. 3).

* cited by examiner

*Primary Examiner* — Thomas Dougherty
*Assistant Examiner* — Karen B Addison
(74) *Attorney, Agent, or Firm* — Collard & Roe, P.C.

(57) ABSTRACT

A surface acoustic wave component contains two fan-shaped interdigital transducers disposed on a piezoelectric substrate, the prongs and gaps of which transducers forming groups having the same length, called cells, between them, and narrow in the averaged prong direction. The cells are structured like cells of unidirectional transducers, and at least one of the fan-shaped interdigital transducers is composed of partial transducers. The partial transducers are disposed one behind the other, perpendicular to the averaged prong direction.

15 Claims, 2 Drawing Sheets

SURFACE ACOUSTIC WAVE COMPONENT

CROSS REFERENCE TO RELATED APPLICATIONS

Applicants claim priority under 35 U.S.C. §119 of German Application No. 10 2012 205 107.4 filed Mar. 29, 2012, the disclosure of which is incorporated by reference.

BACKGROUND OF THE INVENTION

1. Field of the Invention

The present invention is related to the field of electrical technology/electronics and relates to a surface acoustic wave component that is composed of fan-shaped interdigital transducers. The invention can advantageously be used in filters and delay lines on the basis of surface acoustic waves, particularly in those filters and delay lines that have low insertion loss and great bandwidth.

2. The Prior Art

Surface acoustic wave components are known in which interdigital transducers are disposed on a piezoelectric substrate, the prongs and gaps of which transducers form groups having the same length, called cells, between them, and narrow in the average prong direction. The cells are structured like cells of unidirectional transducers, and at least one of the fan-shaped interdigital transducers is composed of two partial transducers.

As a result of the narrowing, prongs and gaps of the fan-shaped interdigital transducers become smaller, to the same degree, from one lateral delimitation to the other lateral delimitation, so that with an increasing frequency, the zone with significant wave excitation and significant reception migrates through the transducer being considered, in the averaged prong direction. The relative bandwidth of the transducers involved and therefore of the component is adjustable, depending on the size of the ratio of maximal and minimal prong width of one and the same prong.

A special embodiment is known from B. Steiner, "Optimising slanted-finger interdigital transducers (SFIT) filters" in Proc. 2001 IEEE Ultrasonics Symposium, pages 1-5, referred to as [1], in which unidirectional transducer cells of the DART type (Distributed Acoustic Reflection Transducer) are used in fan-shaped interdigital transducers, as narrowing cells. This makes it possible to combine the advantages of the possible broad bandwidth of fan-shaped interdigital transducers and the low losses of SPUDT (Single Phase Unidirectional Transducer).

The disadvantage of this special transducer is that it excites not only the basic frequency ($1^{st}$ harmonic), but also signals having double the frequency of the basic frequency, and also receives them. These signals are referred to as $2^{nd}$ harmonic, whereby the ordinal number standing in front of "harmonic" will be referred to as the order of the harmonic hereinafter. In the case of filters that contain this type of fan-shaped interdigital transducer, the $2^{nd}$ harmonic can significantly reduce the stopband attenuation, particularly if these filters have a very broad band. The same holds true for fan-shaped interdigital transducers having cells of the Hanma-Hunsinger type. Instead of the $2^{nd}$ harmonic, the $3^{rd}$ harmonic can lead to problems in the stopband range in filters that contain this transducer type.

Frequently, fan-shaped interdigital transducers are structured with prongs of equal width and gaps of equal width (H. Yatsuda, "Design techniques for SAW filters using slanted finger interdigital transducers," IEEE Trans. Ultrasonics, Ferroelectrics, and Frequency Control Vol. 44 (1997), pages 453-459), referred to as [2], in which transducers the polarity changes from prong to prong. The disadvantage of these interdigital transducers, structured in fan shape, lies in the fact that the advantage of reducing losses by means of the use of unidirectional transducer cells no longer comes to bear.

A further special embodiment of a surface acoustic wave component that contains interdigital transducers having prongs of equal width and gaps of equal width is described in U.S. Pat. No. 6,856,214 B2, referred to as [3]. The component consists of two filters that each consist of two fan-shaped interdigital transducers having prongs of equal width and gaps of equal width. Each fan-shaped interdigital transducer of the first filter is switched in parallel with a fan-shaped interdigital transducer of the second filter. As a result of narrowing of their transducer structures, the filters can be considered in such a way that they contain different frequency tracks along the aperture of the transducer. These frequency tracks are characterized by the period length $\lambda j$, in each instance, where $j=1, \ldots m$, whereby m is the number of frequency tracks, and the center frequency of the frequency track is determined with the index j of $\lambda j$. The fan-shaped interdigital transducers of each filter enclose an interstice. The difference of the transducer interstices of the two filters in the frequency track with the index j amounts to $\lambda j/4$ or an odd-numbered multiple of this. As a result, the waves transmitted by the transducers operated as transmitters and the waves reflected at the transducers operated as receivers compensate one another when they impact the transmitter. As a result, the triple-transit signal, which causes a ripple in the passband of the component, is reduced.

A further special embodiment of a surface acoustic wave component that contains fan-shaped interdigital transducers is known from DE 199 25 800 C1, referred to as [4]. The excitation and reception strength of some cells is reduced by serial switching of sections of these cells that are formed by division in the transversal direction. In this way, a specific weighting of the fan-shaped interdigital transducers can be set, and as a result, the transmission behavior of the filters in question can be improved.

In the embodiments [1] to [4], all the extended prong edges of a fan-shaped interdigital transducer intersect at a point, called the focus, so that each fan-shaped interdigital transducer has a separate focus.

A further known embodiment relates to a surface acoustic wave component that contains step-shaped fan-shaped interdigital transducers. Aside from the step-shaped character of the prongs, the extended prongs of the two fan-shaped interdigital transducers run toward a common focus (DE 199 43 072 B4). In the case of this type of transducer, as well, there is the disadvantage that the harmonics of the $2^{nd}$ or $3^{rd}$ order are not suppressed or are only slightly reduced.

SUMMARY OF THE INVENTION

It is an object of the present invention to structure surface acoustic wave components, in which two fan-shaped interdigital transducers are disposed on a piezoelectric substrate, in such a manner that the $2^{nd}$ harmonic or harmonic of a higher order is suppressed, or two harmonics of a different order are simultaneously at least reduced.

This task is accomplished with the characteristics contained in the claims, whereby the invention also includes combinations of the individual dependent claims in the sense of an AND linkage, as long as they do not mutually exclude one another.

The characteristics according to the invention relate to a surface acoustic wave component that contains two fan-shaped interdigital transducers disposed on a piezoelectric substrate, the prongs and gaps of which transducers form groups having the same length, called cells, between them, and narrow in the averaged prong direction. The cells are structured like cells of unidirectional transducers, and whereby at least one of the fan-shaped interdigital transducers is composed of partial transducers.

The component according to the invention has the following features:

a) the partial transducers are disposed one behind the other, perpendicular to the averaged prong direction, and ba) at least one of the narrowing gaps between two cells of at least one of the fan-shaped interdigital transducers is widened by an additional width Z that narrows in the same manner, of (g+m/h) times the length of a cell that narrows in the same manner, or bb) the narrowing gap of at least one of the fan-shaped interdigital transducers, which is widened by an additional width Z that narrows in the same manner, is selected to be such that the conditions $|\sin(\pi \cdot h_1 \cdot Z/p)| < |\sin(\pi \cdot Z/p)|$ and $|\sin(\pi \cdot h_2 \cdot Z/p)| < |\sin(\pi \cdot Z/p)|$ are fulfilled, whereby p is the length of a cell that narrows in the same manner as the prongs and the gaps, and Z and p, as a result of the narrowing, are each reduced by the same factor in comparison with the maximal dimensions, so that the ratio Z/p is independent of the location in the averaged prong direction, and whereby $h_1$ and $h_2$ are the orders of two harmonics to be at least reduced at the same time, and that c) the cells on the left or on the right of a widened gap belong to different partial transducers, and the cell on the right of a widened gap has an opposite electrical polarity in comparison with the cell disposed on the left of the widened gap, whereby g is a natural number or zero, h is a prime number of the prime factor breakdown of the order of the harmonic to be suppressed, and m is selected as a whole number, in such a manner that it lies in the range of $1 \leq m \leq h-1$.

The way to determine the ratio Z/p will be described below.

A prerequisite is that the orders $h_1$ and $h_2$ of two harmonics to be suppressed simultaneously are selected. Using $h_1$ and $h_2$, the terms $|\sin(\pi \cdot h_1 \cdot Z/p)|$, $|\sin(\pi \cdot h_2 \cdot Z/p)|$, and $|\sin(\pi \cdot Z/p)|$ are calculated as functions of Z/p. In this connection, it is sufficient to restrict the value range of Z/p to Z/p=0 to 1, because of the period of n of $|\sin(\pi \cdot Z/p)|$. In this range of Z/p, there are typically multiple solutions. Of these, those with the maximal suppression of the two harmonics can be selected.

Because the partial transducers are disposed one behind the other, perpendicular to the averaged prong direction, the fan-shaped interdigital transducer in question neither excites the harmonic that is determined by the gap that widens by the narrowing additional width Z, nor can it receive it.

An essential characteristic of the object of the invention is that the cells of one of the partial transducers have an electrical polarity opposite to the other partial transducers. This means that the electrical alternating current in the partial transducer having the opposite electrical polarity flows in the opposite direction, at any desired point in time, in comparison with the other partial transducers, because the electrical alternating field in the partial transducer having the opposite electrical polarity is also directed opposite in comparison with the other partial transducers.

A preferred embodiment of the surface acoustic wave component is that only the fan-shaped interdigital transducer that also has at least one narrowing gap that is widened by a narrowing additional width contains partial transducers having the opposite electrical polarity.

Furthermore, the component according to the invention demonstrates advantageous properties if one of the fan-shaped interdigital transducers has an even number of widened narrowing gaps and the other fan-shaped interdigital transducer, in each instance, has an odd number of widened narrowing gaps.

Preferably, however, the component can also be structured so that one of the fan-shaped interdigital transducers does not have any widened narrowing gaps, and the other fan-shaped interdigital transducer, in each instance, has a widened narrowing gap.

In one embodiment of the invention, one of the fan-shaped interdigital transducers has two widened narrowing gaps and the other fan-shaped interdigital transducer has one widened narrowing gap.

The partial transducers can be switched in parallel, and in this connection, the prongs of the partial transducers that lie at the same potential are connected with one another by means of a common collector electrode.

With the invention, it is furthermore possible that the partial transducers are switched in series, and the electrical connection of those collector electrodes that are electrically connected as a result of the serial connection is structured in such a manner that the respective collector electrode of the $1^{st}$ partial transducer continues as the respective collector electrode of the $2^{nd}$ partial transducer.

The surface wave component can preferably be configured in such a manner that g=0, m=1, and h=2, and therefore the narrowing additional width amounts to half the length of a cell that narrows in the same manner.

However, it can also be true that g=0, m=1 or 2, and h=3, thereby causing the narrowing additional width to amount to one-third or two-thirds of the length of a cell that narrows in the same manner.

The cells of all the partial transducers are preferably cells of the narrowing DART type (Distributed Acoustic Reflection Transducer) or EWC type (Electrode Width Control) or Hanma-Hunsinger type or FEUDT type (Floating Electrode Unidirectional Transducer) or TF type (Two Fingers).

It has also proven to be practical that at least one additional prong is disposed in those narrowing gaps that are widened by a narrowing additional width. An advantageous embodiment of this is that the cells are of the DART type and that two prongs of equal width are disposed in those narrowing gaps that are widened by a narrowing additional width, at a distance between the prong centers of ¼ of the cell length.

It is also particularly practical if the narrowing gap that is widened by the narrowing additional width is disposed in the center or close to the center of the fan-shaped interdigital transducer in question, if the fan-shaped interdigital transducer in question contains only one widened narrowing gap.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

The invention will be described with reference to the following examples.

Example 1

Figure 1:
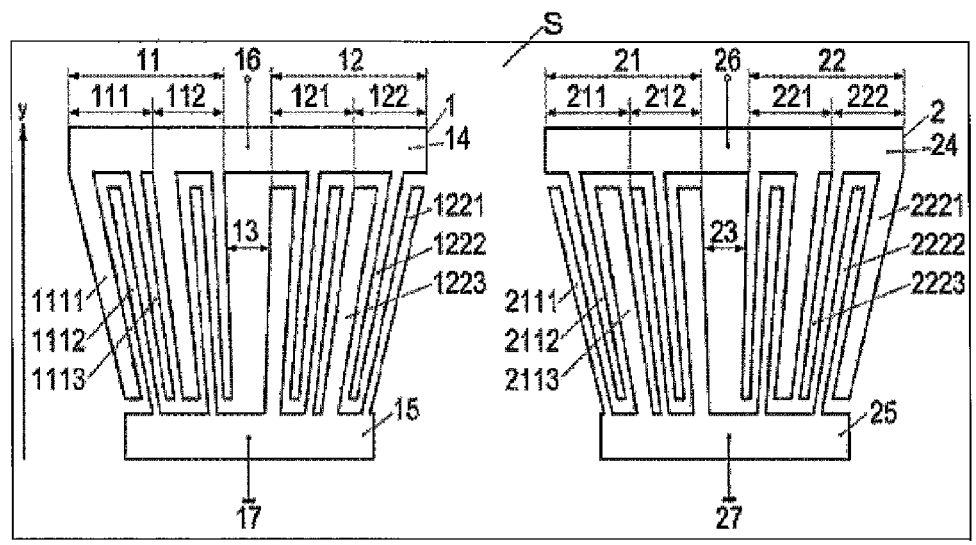
FIG. 1 shows a component having two fan-shaped interdigital transducers, each composed of two partial transducers electrically switched in parallel, in which only one fan-shaped interdigital transducer contains a widened gap.

This exemplary embodiment relates to FIG. 1 and shows a surface acoustic wave component in which two fan-shaped interdigital transducers 1 and 2 are disposed on a piezoelectric substrate S.

In this connection, the fan-shaped interdigital transducer 1 is composed of the partial transducers 11 and 12, which are switched in parallel and which in turn are composed of the cells 111 and 112 or of the cells 121 and 122, respectively.

The partial transducers 11 and 12 shown each contain only two cells, while in practical use, partial transducers generally consist of significantly more cells. The cell type is DART (Distributed Acoustic Reflection Transducer). Its length amounts to a synchronous wavelength that corresponds to the quotient of the phase velocity of the surface acoustic wave and of the center frequency of the component. A DART cell consists of a prong having a width of % of the cell length, referred to as representative for the cells of the partial transducer 11 with 1111, and as representative for the cells of the partial transducer 12 with 1223, and two prongs having a width of $\frac{1}{8}$ of the cell length, referred to as 1112 and 1113 or 1222 and 1221, respectively.

The gaps between the prongs 1111, 1112, 1113, and 1223, 1222, 1221, as well as between two adjacent cells also have a width of $\frac{1}{8}$ of the cell length. The prongs 1111, 1113, and 1222 are connected with the collector electrode 14, while the prongs 1112, 1223, and 1221 are connected with the collector electrode 15.

All the prongs and the gaps that lie between them narrow in the averaged prong direction, counter to the indicated y direction, starting at the collector electrode 14 in the direction of the collector electrode 15. The partial transducers 11 and 12 are disposed one behind the other, perpendicular to the averaged prong direction.

The gap 13 between the cell 112 of the partial transducer 11 and the cell 121 of the partial transducer 12, which gap narrows, like all the prongs and gaps, is widened by an additional width, which narrows in the same manner, of $\frac{1}{2}$ the length of a cell 111, 112, 121, 122, which narrows in the same manner. This is evident from the case g=0, m =1, h=2, which represents suppression of the $2^{nd}$ harmonic. The narrowing width of the gap 13 would amount to $\frac{1}{8}$ of the cell length, like the width of all the gaps, without the additional width.

In the following, the method of functioning of the transducer 1 with regard to suppression or at least reduction of the $2^{nd}$ or higher harmonic will be explained, proceeding from a consideration of the electrical polarity.

For this purpose, the electrical polarity is considered at a point in time when the alternating current flows from the hot connector 16 to the ground connector 17. The cells 111 or 122, respectively, shall be representatives for the cells of the partial transducers 11 and 12. In this case, the alternating current flows from the prongs 1111 and 1113 to the prong 1112 in the cell 111, in other words from the outside to the inside in the cell 111; in contrast, it flows from the prong 1222 to the prongs 1221 and 1223 in the cell 122, in other words from the inside to the outside. Accordingly, the partial transducers 11 and 12 of the fan-shaped interdigital transducer 1 have opposite electrical polarities. Consequently, if the gap 13 were a narrowing gap having the width of $\frac{1}{8}$ the cell length, the waves excited by the partial transducers 11 and 12 in the range of the basic frequency ($1^{st}$ harmonic) would cancel each other out by interference. This is precisely prevented by the narrowing additional width of of the cell length, which corresponds to $\frac{1}{2}$ of the synchronous wavelength, in each instance. In this connection, "synchronous wavelength, in each instance" means a synchronous wavelength modified as a result of the prong and gap narrowing. For the $2^{nd}$ harmonic, however, the narrowing additional width of $\frac{1}{2}$ the cell length corresponds to a whole synchronous wavelength, in each instance, and as a result of the opposite electrical polarity of the partial transducers 11 and 12, this leads to suppression of the $2^{nd}$ harmonic.

The fan-shaped transducer 2 is composed, according to FIG. 1, of the partial transducers 21 and 22, which are switched in parallel and in turn are composed of the cells 211 and 212 or of the cells 221 and 222, respectively. The partial transducers contain only two cells, while in practical applications, partial transducers generally consist of significantly more cells. The cell type is also DART. Its length amounts to a synchronous wavelength, which corresponds to the quotient of the phase velocity of the surface acoustic wave and the center frequency of the component. A DART cell consists of a prong having a width of $\frac{3}{8}$ of the cell length, referred to as representative for the cells of the partial transducer 21 by 2113, and as representative for the cells of the partial transducer 22 by 2221, and two prongs having a width of $\frac{1}{8}$ of the cell length, referred to by 2111 and 2112 or by 2222 and 2223, respectively.

The gaps between the prongs 2111, 2112, 2113, and 2223, 2222, 2221, as well as between two adjacent cells, also have a width of $\frac{1}{8}$ of the cell length. The transducer 2 is the mirror image of the transducer 1, so that the sequence of the prongs 2111, 2112, 2113 is reversed in comparison with the prongs 1221, 1222, 1223. Likewise, the sequence of the prongs 2221, 2222, 2223 is reversed in comparison with the prongs 1111, 1112, 1113. Accordingly, the forward direction, the direction of the higher emitted wave amplitude, of transducer 2 is opposite that of transducer 1, so that as a result of the unidirectionality of the transducers 1 and 2, only slight losses occur as the result of bidirectionality.

The prongs 2112, 2223, and 2221 are connected with the collector electrode 24, while the prongs 2111, 2113, and 2222 are connected with the collector electrode 25. All the prongs and the gaps that lie between them narrow in the averaged prong direction, counter to the indicated y direction, starting at the collector electrode 24 in the direction of the collector electrode 25.

The partial transducers 21 and 22 are disposed one behind the other, perpendicular to the averaged prong direction. The gap 23 between the cell 212 of the partial transducer 21 and the cell 221 of the partial transducer 22, which narrows like all the prongs and gaps, is not widened, and its width, like the width of all the gaps, amounts to ⅛ of the cell length. In the drawing, the gap 23 is shown in exaggerated form only because of its importance.

Consideration of the electrical polarity at the point in time when the alternating current flows from the hot connector 26 to the ground connector 27 yields the following:

The cells 211 or 222, respectively, shall be representatives for the cells of the partial transducers 21 and 22. In this case, the alternating current flows from the prong 2112 to the prongs 2111 and 2113 in the cell 211, in other words from the inside to the outside in the cell 211; in contrast, it flows from the prongs 2221 and 2223 to the prong 2222 in the cell 222, in other words from the outside to the inside. Accordingly, the partial transducers 21 and 22 of the fan-shaped interdigital transducer 2 have opposite electrical polarities.

An alternative embodiment of Example 1 consists in widening the gap 23 between the cell 212 of the partial transducer 21 and the cell 221 of the partial transducer 22, which narrows, like all the prongs and gaps, by an additional width, which narrows in the same manner, of ⅓ of the length of a cell 211, 212, 221, 222, which narrows in the same manner. This is evident from the case g=0, m=1, h=3, which represents suppression of the $3^{rd}$ harmonic. Accordingly, transducer 1 suppresses the $2^{nd}$ harmonic, and transducer 2 at least reduces the $3^{rd}$ harmonic, so that the filter composed of the transducers 1 and 2 reduces not only the influence of the $2^{nd}$ but also that of the $3^{rd}$ harmonic on the stopband attenuation.

Example 2

Figure 2:
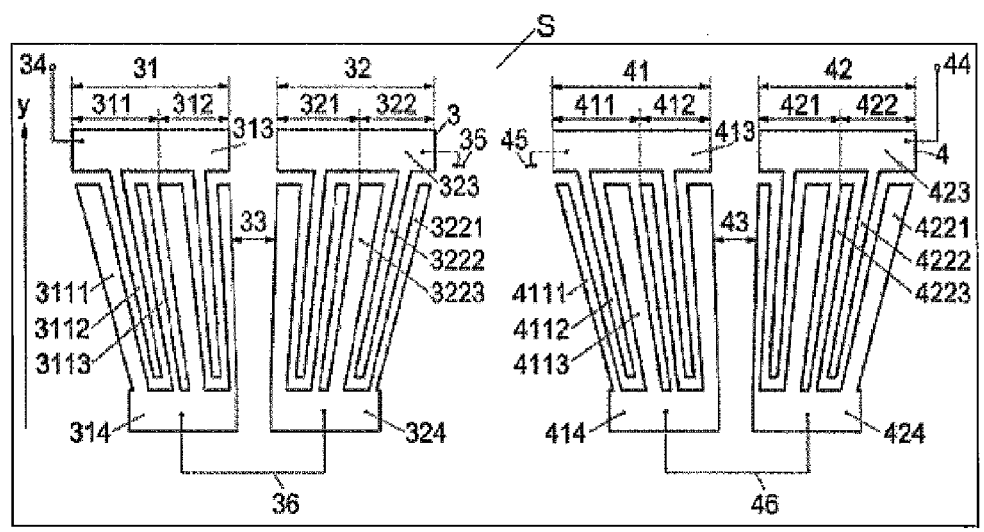
FIG. 2 shows a component having two fan-shaped interdigital transducers, each composed of two partial transducers electrically switched in series, in which only one fan-shaped interdigital transducer contains a widened gap.

This exemplary embodiment relates to FIG. 2 and shows a surface acoustic wave component in which two fan-shaped interdigital transducers 3 and 4 are disposed on a piezoelectric substrate S.

In this connection, the fan-shaped interdigital transducer 3 is composed of the partial transducers 31 and 32, which are switched in series and which in turn are composed of the cells 311 and 312 or of the cells 321 and 322, respectively.

The partial transducers shown each contain only two cells, while in practical use, partial transducers generally consist of significantly more cells. Here, too, the cell type is DART. Its length amounts to a synchronous wavelength that corresponds to the quotient of the phase velocity of the surface acoustic wave and of the center frequency of the component. A DART cell consists of a prong having a width of ⅜ of the cell length, referred to as representative for the cells of the partial transducer 31 with 3111, and as representative for the cells of the partial transducer 32 with 3223, and two prongs having a width of ⅛ of the cell length, referred to as 3112 and 3113 or 3222 and 3221, respectively.

The gaps between the prongs 3111, 3112, 3113, and 3223, 3222, 3221, as well as between two adjacent cells also have a width of ⅛ of the cell length. The prong 3112 is connected with the collector electrode 313 of the partial transducer 31, while the prongs 3111 and 3113 are connected with the collector electrode 314 of the partial transducer 31. In the partial transducer 32, the prong 3222 is connected with the collector electrode 323, while the prongs 3221 and 3223 are connected with the collector electrode 324.

All the prongs and the gaps that lie between them narrow in the averaged prong direction, counter to the indicated y direction, starting at the collector electrodes 313 and 323, in the direction of the collector electrodes 314 and 324. The partial transducers 31 and 32 are disposed one behind the other, perpendicular to the averaged prong direction.

The gap 33 between the cell 312 of the partial transducer 31 and the cell 321 of the partial transducer 32, which gap narrows, like all the prongs and gaps, is widened by an additional width, which narrows in the same manner, of ½ of the length of a cell 311, 312, 321, 322, which narrows in the same manner. This is evident from the case g=0, m=1, h=2, which represents suppression of the $2^{nd}$ harmonic. The narrowing width of the gap 33 would amount to ⅛ of the cell length, like the width of all the gaps, without the additional width.

In the following, the method of functioning of the transducer 3 with regard to suppression or at least reduction of the $2^{nd}$ or higher harmonic will be explained, proceeding from a consideration of the electrical polarity.

For this purpose, the electrical polarity is considered at a point in time when the alternating current flows from the hot connector 34 of the partial transducer 31, by way of the connection 36, to the ground connector 35 of the partial transducer 32. The cells 311 or 322, respectively, shall be representatives for the cells of the partial transducers 31 and 32. In this case, the alternating current flows from the prong 3112 to the prongs 3111 and 3113 in the cell 311, in other words from the inside to the outside in the cell 311; in contrast, it flows from the prongs 3221 and 3223 to the prong 3222 in the cell 322, in other words from the outside to the inside. Accordingly, the partial transducers 31 and 32 of the fan-shaped interdigital transducer 3 have opposite electrical polarities. Consequently, if the gap 33 were a narrowing gap having the width of ⅛ of the cell length, the waves excited by the partial transducers 31 and 32 in the range of the basic frequency ($1^{st}$ harmonic) would cancel each other out by interference. This is precisely prevented by the narrowing additional width of ¼ of the cell length, which corresponds to ½ of the synchronous wavelength, in each instance. In this connection, "synchronous wavelength in each instance" means a synchronous wavelength modified as a result of the prong and gap narrowing. For the $2^{nd}$ harmonic, however, the narrowing additional width of of the cell length corresponds to a whole synchronous wavelength, in each instance, and as a result of the opposite electrical polarity of the partial transducers 31 and 32, this leads to suppression of the $2^{nd}$ harmonic.

The fan-shaped transducer 4 is composed, according to FIG. 2, of the partial transducers 41 and 42, which are switched in series and in turn are composed of the cells 411 and 412 or of the cells 421 and 422, respectively. The partial transducers shown contain only two cells, while in practical applications, partial transducers generally consist of significantly more cells. The cell type is also DART. Its length amounts to a synchronous wavelength, which corresponds to the quotient of the phase velocity of the surface acoustic wave and the center frequency of the component. A DART cell consists of a prong having a width of ⅜ of the cell length, referred to as representative for the cells of the partial transducer 41 by 4113, and as representative for the cells of the partial transducer 42 by 4221, and two prongs having a width of ⅛ of the cell length, referred to by 4111 and 4112 or by 4222 and 4223, respectively.

The gaps between the prongs 4111, 4112, 4113, and 4223, 4222, 4221, as well as between two adjacent cells, also have a width of ⅛ of the cell length. The prong 4112 is connected with the collector electrode 413 of the partial transducer 41, while the prongs 4111 and 4113 are connected with the collector electrode 414 of the partial transducer 41. In the partial transducer 42, the prong 4222 is connected with the collector electrode 423, while the prongs 4221 and 4223 are connected with the collector electrode 424.

All the prongs and the gaps that lie between them narrow in the averaged prong direction, counter to the indicated y direction, starting at the collector electrodes 413 and 423 in the direction of the collector electrodes 414 and 424. The partial transducers 41 and 42 are disposed one behind the other, perpendicular to the averaged prong direction.

The gap 43 between the cell 412 of the partial transducer 41 and the cell 421 of the partial transducer 42, which narrows like all the prongs and gaps, is widened by ½ the length of a cell 411, 412, 421, 422, which narrows in the same manner. This is evident from the case g=0, m=1, h=2, which represents suppression of the $2^{nd}$ harmonic. The narrowing width of the gap 43 would amount to ⅛ of the cell length, like the width of all the gaps, without the additional width.

Consideration of the electrical polarity at the point in time when the alternating current flows from the hot connector 44 of the partial transducer 42, by way of the connection 46, to the ground connector 45 of the partial transducer 41 yields the following:

The cells 411 or 422, respectively, shall be representatives for the cells of the partial transducers 41 and 42. In this case, the alternating current flows from the prong 4222 to the prongs 4221 and 4223 in the cell 422, in other words from the inside to the outside in the cell 422; in contrast, it flows from the prongs 4111 and 4113 to the prong 4112 in the cell 411, in other words from the outside to the inside. Accordingly, the partial transducers 41 and 42 of the fan-shaped interdigital transducer 4 have opposite electrical polarities. Consequently, if the gap 43 were a narrowing gap having the width of ⅛ of the cell length, the waves excited by the partial transducers 41 and 42 in the range of the basic frequency ($1^{st}$ harmonic) would cancel each other out by interference. This is precisely prevented by the narrowing additional width of ½ the cell length, which corresponds to of the synchronous wavelength, in each instance. In this connection, "synchronous wavelength, in each instance" means a synchronous wavelength modified as a result of the prong and gap narrowing. For the $2^{nd}$ harmonic, however, the narrowing additional width of of the cell length corresponds to a whole synchronous wavelength, in each instance, and as a result of the opposite electrical polarity of the partial transducers 41 and 42, this leads to suppression of the $2^{nd}$ harmonic.

An alternative embodiment of Example 2 consists in widening the gap 43 between the cell 412 of the partial transducer 41 and the cell 421 of the partial transducer 42, which narrows, like all the prongs and gaps, by an additional width, which narrows in the same manner, of ⅓ of the length of a cell 411, 412, 421, 422, which narrows in the same manner. This is evident from the case g=0, m=1, h=3, which represents suppression of the $3^{rd}$ harmonic. Accordingly, transducer 3 suppresses the $2^{nd}$ harmonic, and transducer 4 at least reduces the $3^{rd}$ harmonic, so that the filter composed of the transducers 3 and 4 reduces not only the influence of the $2^{nd}$ but also that of the $3^{rd}$ harmonic on the stopband attenuation.

Example 3

Figure 3:
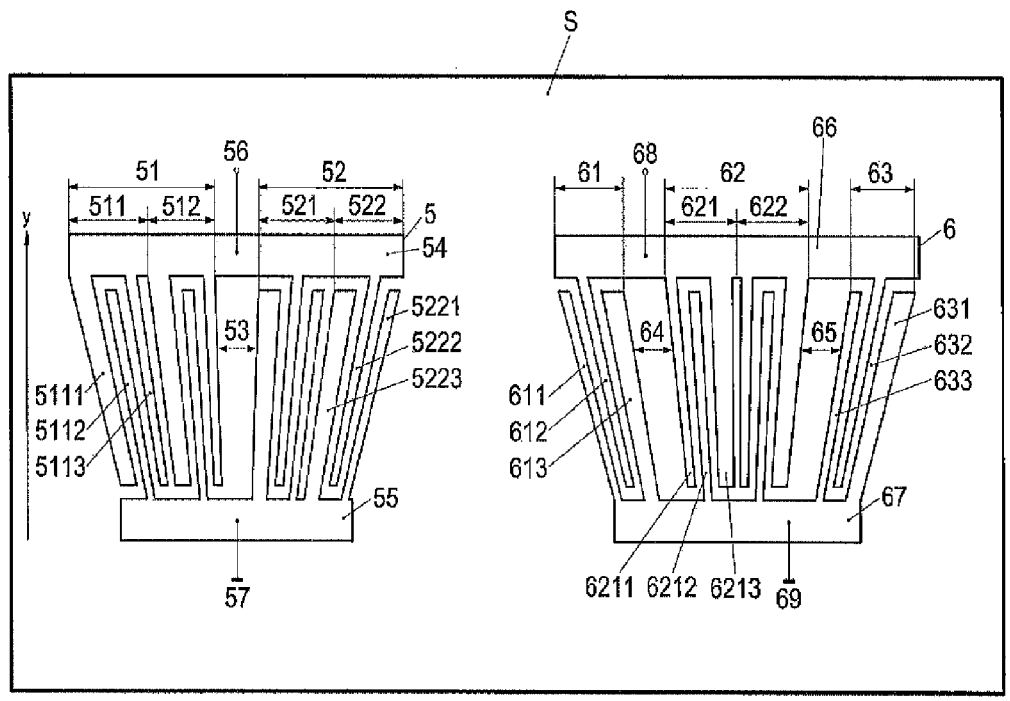
FIG. 3 shows a component having two fan-shaped interdigital transducers, each composed of two or four partial transducers electrically switched in parallel, in which both fan-shaped interdigital transducers contain at least one widened gap.

This exemplary embodiment relates to FIG. 3 and shows a surface acoustic wave component in which two fan-shaped interdigital transducers 5 and 6 are disposed on a piezoelectric substrate S.

In this connection, the fan-shaped interdigital transducer 5 is composed of the partial transducers 51 and 52, which are switched in parallel and which in turn are composed of the cells 511 and 512 or of the cells 521 and 522, respectively.

The partial transducers 51 and 52 shown each contain only two cells, while in practical use, partial transducers generally consist of significantly more cells. The cell type is DART (Distributed Acoustic Reflection Transducer). Its length amounts to a synchronous wavelength that corresponds to the quotient of the phase velocity of the surface acoustic wave and of the center frequency of the component. A DART cell consists of a prong having a width of ⅜ of the cell length, referred to as representative for the cells of the partial transducer 51 with 5111, and as representative for the cells of the partial transducer 52 with 5223, and two prongs having a width of ⅛ of the cell length, referred to as 5112 and 5113 or 5222 and 5221, respectively.

The gaps between the prongs 5111, 5112, 5113, and 5223, 5222, 5221, as well as between two adjacent cells also have a width of ⅛ of the cell length. The prongs 5111, 5113, and 5222 are connected with the collector electrode 54, while the prongs 5112, 5223, and 5221 are connected with the collector electrode 55.

All the prongs and the gaps that lie between them narrow in the averaged prong direction, counter to the indicated y direction, starting at the collector electrode 54 in the direction of the collector electrode 55. The partial transducers 51 and 52 are disposed one behind the other, perpendicular to the averaged prong direction.

The gap 53 between the cell 512 of the partial transducer 51 and the cell 521 of the partial transducer 52, which gap narrows, like all the prongs and gaps, is widened by an additional width, which narrows in the same manner, of ½ of the length of a cell 511, 512, 521, 522, which narrows in the same manner. This is evident from the case g=0, m=1, h=2, which represents suppression of the $2^{nd}$ harmonic. The narrowing width of the gap 53 would amount to ⅛ of the cell length, like the width of all the gaps, without the additional width.

In the following, the method of functioning of the transducer 5 with regard to suppression or at least reduction of the $2^{nd}$ or higher harmonic will be explained, proceeding from a consideration of the electrical polarity.

For this purpose, the electrical polarity is considered at a point in time when the alternating current flows from the hot connector 56 to the ground connector 57. The cells 511 or 522, respectively, shall be representatives for the cells of the partial transducers 51 and 52. In this case, the alternating current flows from the prongs 5111 and 5113 to the prong 5112 in the cell 511, in other words from the outside to the inside in the cell 511; in contrast, it flows from the prong 5222 to the prongs 5221 and 5223 in the cell 522, in other words from the inside to the outside. Accordingly, the partial transducers 51 and 52 of the fan-shaped interdigital transducer 5 have opposite electrical polarities. Consequently, if the gap 53 were a narrowing gap having the width of ⅛ of the cell length, the waves excited by the partial transducers 51 and 52 in the range of the basic frequency ($1^{st}$ harmonic) would cancel each other out by interference. This is precisely prevented by the narrowing additional width of of the cell length, which corresponds to ½ of the synchronous wavelength, in each instance. In this connection, "synchronous wavelength, in each instance" means a synchronous wavelength modified as a result of the prong and gap narrowing. For the $2^{nd}$ harmonic, however, the narrowing additional width of ½ of the cell length corresponds to a whole synchronous wavelength, in each instance, and as a result of the opposite electrical polarity of the partial transducers 51 and 52, this leads to suppression of the $2^{nd}$ harmonic.

The fan-shaped transducer 6 is composed, according to FIG. 3, of the partial transducers 61, 62, and 63. The partial transducer 62 is composed of the cells 621 and 622. The partial transducers 61 and 63 contain only one cell, in each instance, and the partial transducer 62 contains only two cells, while in practical applications, partial transducers generally consist of significantly more cells. The cell type is also DART. Its length amounts to a synchronous wavelength, which corresponds to the quotient of the phase velocity of the surface acoustic wave and of the center frequency of the component. A DART cell consists of a prong having a width of ⅜ of the cell length, referred to as representative for the cells of the partial transducer 61 by 613, and as representative for the cells of the partial transducer 62 by 6213, and as representative for the cells of the partial transducer 63 by 631, and two prongs having a width of ⅛ of the cell length, referred to by 611 and 612 or by 6211 and 6212 or by 632 and 633, respectively.

The gaps between the prongs 611, 612, 613, and 6211, 6212, 6213, as well as between two adjacent cells, also have a width of ⅛ of the cell length, except for the gaps 64 and 65 that are disposed between the adjacent partial transducers 61 and 62 or 62 and 63, respectively. The sequence of the prongs 611, 612, 613 and 6211, 6212, 6213, as well as 631, 632, 633, is reversed in comparison with the prongs 5111, 5112, 5113 and 5221, 5222, 5223. Accordingly, the forward direction, the direction of the higher emitted wave amplitude, of the transducer 6 is opposite that of transducer 5, so that as a result of the unidirectionality of the transducers 5 and 6, only slight losses occur as the result of bidirectionality.

The prongs 612, 6211, 6213, and 632 are connected with the collector electrode 66, while the prongs 611, 613, 6212, 631, and 633 are connected with the collector electrode 67. All the prongs and the gaps that lie between them narrow in the averaged prong direction, counter to the indicated y direction, starting at the collector electrode 66 in the direction of the collector electrode 67.

The partial transducers 61, 62, and 63 are disposed one behind the other, perpendicular to the averaged prong direction. The gaps 64 and 65 between the partial transducer 61 and the partial transducer 62, or between the partial transducer 62 and the partial transducer 63, respectively, which narrow like all the prongs and gaps, is widened, by an additional width of of the length of a cell 621, 622, which narrows in the same manner. This is evident from the case g=0, m=1, h=2, which represents suppression of the $2^{nd}$ harmonic. Without the additional width, the narrowing width of the gaps 64 and 65 would amount to ⅛ of the cell length, like the width of all the gaps.

Consideration of the electrical polarity at the point in time when the alternating current flows from the hot connector 68 to the ground connector 69 yields the following:

The partial transducers themselves shall be representatives for the cells of the partial transducers 61 and 63. The cell 621 shall be the representative for the partial transducer 62. In this case, the alternating current flows from the prong 612 to the prongs 611 and 613, or from the prong 632 to the prongs 631 and 633, respectively in the cells of the partial transducers 61 and 63, in other words from the inside to the outside in the cells of the partial transducers 61 and 63; in contrast, it flows from the prongs 6211 and 6213 to the prong 6212 in the cell 621, in other words from the outside to the inside. Accordingly, the electrical polarities of the partial transducers 61 and 63 of the fan-shaped interdigital transducer 6, on the one hand, and of the partial transducer 62, on the other hand, are opposite to one another.

An alternative embodiment of Example 3 consists of the following:

In the fan-shaped interdigital transducer 5, the gap 53 between the cell 512 of the partial transducer 51 and the cell 521 of the partial transducer 52, which narrows, like all the prongs and gaps, is widened by an additional width, which narrows in the same manner, of ⅓ of the length of a cell 511, 512, 521, 522, which narrows in the same manner. Furthermore, the gaps 64 and 65 between the partial transducer 61 and the partial transducer 62 or between the partial transducer 62 and the partial transducer 63, respectively, which narrow, like all the prongs and gaps, are widened by an additional width, which narrows in the same manner, of ⅓ of the length of a cell 621, 622, which narrows in the same manner. This is evident from the case g=0, m=1, h=3, which represents suppression of the $3^{rd}$ harmonic.

Example 4

Figure 4:
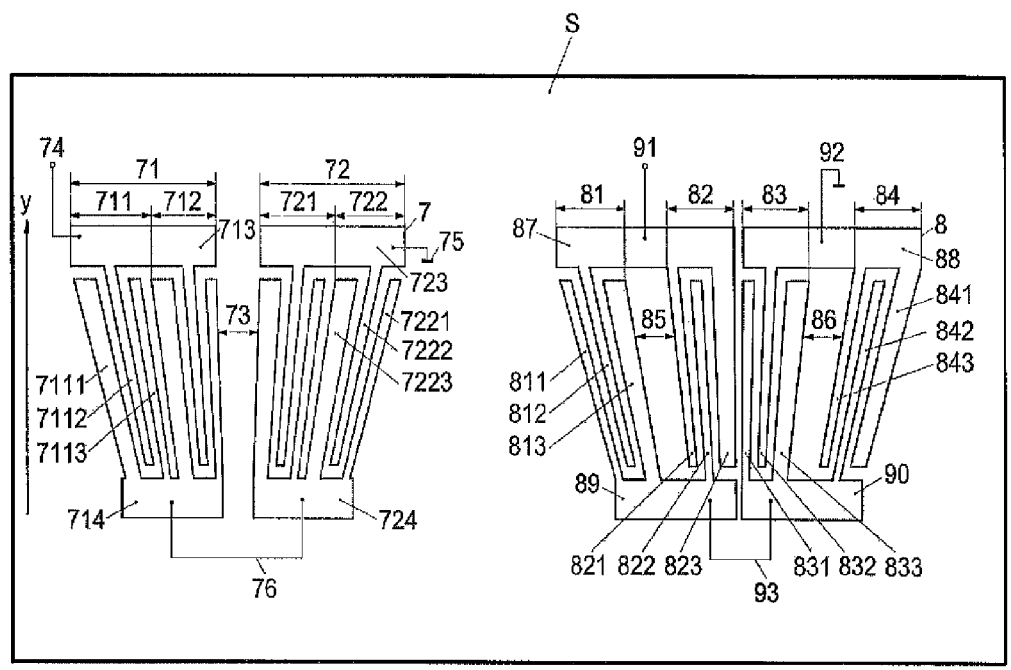
FIG. 4 shows a component having two fan-shaped interdigital transducers, in which both fan-shaped interdigital transducers contain at least one widened gap, whereby the fan-shaped transducers each consist of two partial transducer groups of two partial transducers each, and whereby the partial transducer groups are electrically switched in series, and the partial transducers of one and the same group are switched in parallel.

This exemplary embodiment relates to FIG. 4 and shows a surface acoustic wave component in which two fan-shaped interdigital transducers 7 and 8 are disposed on a piezoelectric substrate S.

In this connection, the fan-shaped transducer 7 is composed of the partial transducers 71 and 72, which are switched in series and which in turn are composed of the cells 711 and 712 or of the cells 721 and 722, respectively.

The partial transducers shown each contain only two cells, while in practical use, partial transducers generally consist of significantly more cells. The cell type is DART here, as well. Its length amounts to a synchronous wavelength that corresponds to the quotient of the surface acoustic wave and of the center frequency of the component. A DART cell consists of a prong having a width of ⅜ of the cell length, referred to as representative for the cells of the partial transducer 71 with 7111, and as representative for the cells of the partial transducer 72 with 7223, and two prongs having a width of ⅛ of the cell length, referred to as 7112 and 7113 or 7222 and 7221, respectively.

The gaps between the prongs 7111, 7112, 7113, and 7223, 7222, 7221, as well as between two adjacent cells also have a width of ⅛ of the cell length. The prong 7112 is connected with the collector electrode 713 of the partial transducer 71, while the prongs 7111 and 7113 are connected with the collector electrode 714 of the partial transducer 71. In the partial transducer 72, the prong 7222 is connected with the collector electrode 723, while the prongs 7221 and 7223 are connected with the collector electrode 724.

All the prongs and the gaps that lie between them narrow in the averaged prong direction, counter to the indicated y direction, starting at the collector electrodes 713 and 723 in the direction of the collector electrodes 714 and 724. The partial transducers 71 and 72 are disposed one behind the other, perpendicular to the averaged prong direction.

The gap 73 between the cell 712 of the partial transducer 71 and the cell 721 of the partial transducer 72, which gap narrows, like all the prongs and gaps, is widened by an additional width, which narrows in the same manner, of ½ the length of a cell 711, 712, 721, 722, which narrows in the same manner. This is evident from the case g=0, m=1, h=2, which represents suppression of the $2^{nd}$ harmonic. The narrowing width of the gap 73 would amount to ⅛ of the cell length, like the width of all the gaps, without the additional width.

In the following, the method of functioning of the transducer 7 with regard to suppression or at least reduction of the $2^{nd}$ or higher harmonic will be explained, proceeding from a consideration of the electrical polarity.

For this purpose, the electrical polarity is considered at a point in time when the alternating current flows from the hot connector 74 of the partial transducer 71, by way of the connection 76, to the ground connector 75 of the partial transducer 72. The cells 711 or 722, respectively, shall be representatives for the cells of the partial transducers 71 and 72. In this case, the alternating current flows from the prong 7112 to the prongs 7111 and 7113 in the cell 711, in other words from the inside to the outside in the cell 711; in contrast, it flows from the prongs 7221 and 7223 to the prong 7222 in the cell 722, in other words from the outside to the inside. Accordingly, the partial transducers 71 and 72 of the fan-shaped interdigital transducer 7 have opposite electrical polarities. Consequently, if the gap 73 were a narrowing gap having the width of ⅛ of the cell length, the waves excited by the partial transducers 71 and 72 in the range of the basic frequency (1$^{st}$ harmonic) would cancel each other out by interference. This is precisely prevented by the narrowing additional width of ½ the cell length, which corresponds to ½ of the synchronous wavelength, in each instance. In this connection, "synchronous wavelength, in each instance" means a synchronous wavelength modified as a result of the prong and gap narrowing. For the 2$^{nd}$ harmonic, however, the narrowing additional width of of the cell length corresponds to a whole synchronous wavelength, in each instance, and as a result of the opposite electrical polarity of the partial transducers 71 and 72, this leads to suppression of the 2$^{nd}$ harmonic.

The fan-shaped transducer 8 is composed, according to FIG. 4, of the partial transducers 81, 82, 83, and 84. The partial transducers 81 and 82 or 83 and 84, respectively, are switched in parallel, and switched in series in pairs. The partial transducers 81, 82, 83, and 84 each contain only one cell, while in practical applications, partial transducers generally consist of significantly more cells. The cell type is also DART. Its length amounts to a synchronous wavelength, which corresponds to the quotient of the phase velocity of the surface acoustic wave and of the center frequency of the component. A DART cell consists of a prong having a width of ⅜ of the cell length, referred to as representative for the cells of the partial transducer 81 by 813, as representative for the cells of the partial transducer 82 by 823, as representative for the cells of the partial transducer 83 by 833, and as representative for the cells of the partial transducer 84 by 841, and of two prongs having a width of ⅛ of the cell length, referred to by 811 and 812 or by 821 and 822 or by 831 and 832, or by 842 and 843, respectively.

The gaps between the prongs 811, 812, 813, and 821, 822, 823, and 831, 832, 833, and 841, 842, 843, as well as between two adjacent cells, also have a width of ⅛ of the cell length, except for the gaps 85 and 86, which are disposed between the adjacent partial transducers 81 and 82 or 83 and 84, respectively. The sequence of the prongs 811, 812, 813 and 821, 822, 823 and 831, 832, 833 as well as 843, 842, 841 is reversed in comparison with the prongs 7111, 7112, 7113 and 7221, 7222, 7223. Accordingly, the forward direction, the direction of the higher emitted wave amplitude, of the transducer 8 is opposite that of transducer 7, so that as a result of the unidirectionality of the transducers 7 and 8, only slight losses occur as the result of bidirectionality.

The prongs 812, 821, and 823 are connected with the collector electrode 87, while the prongs 811, 813, and 822 are connected with the collector electrode 89. The prongs 832, 841, and 843 are connected with the collector electrode 88, while the prongs 831, 833, and 842 are connected with the collector electrode 90. All the prongs and the gaps that lie between them narrow in the averaged prong direction, counter to the indicated y direction, starting at the collector electrodes 87 and 88 in the direction of the collector electrodes 89 and 90.

The partial transducers 81, 82, 83, and 84 are disposed one behind the other, perpendicular to the averaged prong direction. The gaps 85 and 86 between the partial transducer 81 and the partial transducer 82, or between the partial transducer 83 and the partial transducer 84, respectively, which gaps narrow like all the prongs and gaps, are widened by an additional width, which narrows in the same manner, of ½ the length of a cell 81, 82, 83, 84, which narrows in the same manner, whereby here, these cells simultaneously represent the partial transducers of the fan-shaped transducer 8. This is evident from the case g=0, m=1, h=2, which represents suppression of the 2$^{nd}$ harmonic. The narrowing width of the gaps 85 and 86 would amount to ⅛ of the cell length, like the width of all the gaps, without the additional width.

Consideration of the electrical polarity at the point in time when the alternating current flows from the hot connector 91, by way of the connection 93, to the ground connector 92 yields the following:

The partial transducers themselves are the representatives for the cells of the partial transducers 81, 82, 83, and 84. In this case, the alternating current flows from the prong 812 to the prongs 811 and 813 in the cells of the partial transducer 81, in other words from the inside to the outside. In contrast, the alternating current flows from the prongs 821 and 823 to the prong 822 in the partial transducer 82, in other words from the outside to the inside. Accordingly, the electrical polarities of the partial transducers 81 and 82 of the fan-shaped interdigital transducer 8 are opposite to one another. In the cells of the partial transducer 83, the alternating current flows from the prongs 831 and 833 to the prong 832, in other words from the outside to the inside. In contrast, the alternating current flows from the prong 842 to the prongs 841 and 843 in the partial transducer 84, in other words from the inside to the outside. Accordingly, the electrical polarities of the partial transducers 83 and 84 of the fan-shaped interdigital transducer 8 are opposite to one another.

An alternative embodiment of Example 4 consists of the following:

In the fan-shaped interdigital transducer 7, the gap 73 between the cell 712 of the partial transducer 71 and the cell 721 of the partial transducer 72, which narrows, like all the prongs and gaps, is widened by an additional width, which narrows in the same manner, of ⅓ of the length of a cell 711, 712, 721, 722, which narrows in the same manner. Furthermore, the gaps 85 and 86 between the partial transducer 81 and the partial transducer 82 or between the partial transducer 83 and the partial transducer 84, which gaps narrow, like all the prongs and gaps, is widened by an additional width, which narrows in the same manner, of ⅓ of the length of a cell 81, 82, 83, and 84, which narrows in the same manner, whereby here, these cells simultaneously represent the partial transducers of the fan-shaped transducer 8. This is evident from the case g=0, m=1, h=3, which represents suppression of the 3$^{rd}$ harmonic.

One of the common features of Examples 1 to 4 consists in that the cells of different fan-shaped transducers demonstrate opposite electrical polarities when a narrowing gap widened by ½ of a cell length is situated between them. This also holds true for the alternative embodiments having narrowing gaps widened by ⅓ of a cell length.

Accordingly, while only a few embodiments of the present invention have been shown and described, it is obvious that many changes and modifications may be made thereunto without departing from the spirit and scope of the invention.

What is claimed is:

1. A surface acoustic wave component comprising:
 two fan-shaped interdigital transducers disposed on a piezoelectric substrate, said transducers having prongs and gaps that lie between the prongs forming groups having the same length, and narrow in an averaged prong direction, said groups being structured as cells of unidirectional transducers, wherein at least one of the fan-shaped interdigital transducers is composed of partial transducers, wherein:
a) the partial transducers are disposed one behind the other, perpendicular to the averaged prong direction,
ba) at least one of the narrowing gaps between two cells of at least one of the fan-shaped interdigital transducers is widened by an additional width Z that narrows in the same manner, of (g+m/h) times the length of a cell that narrows in the same manner, or
bb) the narrowing gap of at least one of the fan-shaped interdigital transducers, which is widened by an additional width Z that narrows in the same manner, is selected to be such that the conditions $|\sin(\pi \cdot h_1 \cdot Z/p)| < |\sin(\pi \cdot Z/p)|$ and $|\sin(\pi \cdot h_2 \cdot Z/p)| < |\sin(\pi \cdot Z/p)|$ are fulfilled, whereby p is the length of a cell that narrows in the same manner as the prongs and the gaps, and Z and p, as a result of the narrowing, are reduced by the same factor in comparison with maximal dimensions, so that the ratio Z/p is independent of the location in the averaged prong direction, and whereby $h_1$ and $h_2$ are the orders of two harmonics to be suppressed at the same time, and that
c) the cells on a left or on a right of a widened gap belong to different partial transducers, and the cell on the right of a widened gap has an opposite electrical polarity in comparison with the cell disposed on the left of the widened gap, wherein g is a natural number or zero, h is a prime number of the prime factor breakdown of the order of the harmonic to be suppressed, and m is selected as a whole number that lies in the range of $1 \leq m \leq h-1$.

2. The surface acoustic wave component according to claim 1, wherein only the fan-shaped interdigital transducer that also has at least one narrowing gap that is widened by a narrowing additional width contains partial transducers having the opposite electrical polarity.

3. The surface acoustic wave component according to claim 1, wherein one of the fan-shaped interdigital transducers has an even number of widened narrowing gaps and the other fan-shaped interdigital transducer has an odd number of widened narrowing gaps.

4. The surface acoustic wave component according to claim 3, wherein one of the fan-shaped interdigital transducers has two widened narrowing gaps and the other fan-shaped interdigital transducer, in each instance, has one widened narrowing gap.

5. The surface acoustic wave component according to claim 1, wherein one of the fan-shaped interdigital transducers does not have any widened narrowing gaps, and the other fan-shaped interdigital transducer has a widened narrowing gap.

6. The surface acoustic wave component according to claim 1, wherein the partial transducers are switched in parallel.

7. The surface acoustic wave component according to claim 6, wherein in the case of parallel connection, the prongs of the partial transducers that lie at the same potential are connected with one another by means of a common collector electrode.

8. The surface acoustic wave component according to claim 1, wherein the partial transducers are switched in series.

9. The surface acoustic wave component according to claim 8, wherein the electrical connection of those collector electrodes that are electrically connected as a result of the serial connection is structured so that the respective collector electrode of the $1^{st}$ partial transducer continues as the respective collector electrode of the $2^{nd}$ partial transducer.

10. The surface acoustic wave component according to claim 1 wherein g=0, m=1, and h=2, and therefore the narrowing additional width amounts to half the length of a cell that narrows in the same manner.

11. The surface acoustic wave component according to claim 1, wherein g=0, m=1 or 2, and h=3, thereby causing the narrowing additional width to amount to one-third or two-thirds of the length of a cell that narrows in the same manner.

12. The surface acoustic wave component according to claim 1, wherein the cells of all the partial transducers are cells selected from the group consisting of the narrowing DART type (Distributed Acoustic Reflection Transducer), EWC type (Electrode Width Control), Hanma-Hunsinger type, FEUDT type (Floating Electrode Unidirectional Transducer) and TF type (Two Fingers).

13. The surface acoustic wave component according to claim 1, wherein at least one additional prong is disposed in those narrowing gaps that are widened by a narrowing additional width.

14. The surface acoustic wave component according to claim 13, wherein the cells are of the DART type and wherein two prongs of equal width are disposed in those narrowing gaps that are widened by a narrowing additional width, at a distance between the prong centers of ¼ of the cell length.

15. The surface acoustic wave component according to claim 1, wherein the narrowing gap that is widened by the narrowing additional width is disposed in the center of one of the fan-shaped interdigital transducers, when said one fan-shaped interdigital transducer contains only one widened narrowing gap.

* * * * *